(12) United States Patent
Tsuruyama et al.

(10) Patent No.: US 10,141,850 B2
(45) Date of Patent: Nov. 27, 2018

(54) COMPARATOR CIRCUIT, POWER SUPPLY CONTROL IC, AND SWITCHING POWER SUPPLY DEVICE

(71) Applicant: Rohm Co., Ltd., Kyoto (JP)

(72) Inventors: Genki Tsuruyama, Kyoto (JP); Tetsuo Tateishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 222 days.

(21) Appl. No.: 15/094,245

(22) Filed: Apr. 8, 2016

(65) Prior Publication Data

US 2016/0322902 A1 Nov. 3, 2016

(30) Foreign Application Priority Data

Apr. 30, 2015 (JP) .................................. 2015-093249

(51) Int. Cl.
*H02M 3/158* (2006.01)
*H03K 5/24* (2006.01)

(52) U.S. Cl.
CPC ........ *H02M 3/1588* (2013.01); *H03K 5/2472* (2013.01); *Y02B 70/1466* (2013.01)

(58) Field of Classification Search
CPC ............ H02M 3/00; H02M 3/02; H02M 3/10; H02M 3/155; H02M 3/156; H02M 3/1563; H02M 3/157; H02M 3/158; H02M 3/1582; H02M 3/1584; H02M 3/1588; H02M 2001/0009; H02M 2001/0012; H02M 2001/0025; H02M 2001/0032; H02M 2001/0038; H02M 2001/0041; H02M 1/08; H02M 1/14; H02M 1/32; H02M 1/36; H02M 1/44; G05F 1/468; H03M 1/10; H03M 1/12; H03M 1/66; H03M 1/1009;
(Continued)

(56) References Cited

U.S. PATENT DOCUMENTS 7,482,793 B2 * 1/2009 Stoichita ............. H02M 3/1563
323/271
8,040,263 B2 10/2011 Nakajima
(Continued)

FOREIGN PATENT DOCUMENTS

JP 2010-035140 2/2010

*Primary Examiner* — Timothy J. Dole
*Assistant Examiner* — Carlos Rivera-Perez
(74) *Attorney, Agent, or Firm* — Fish & Richardson P.C.

(57) ABSTRACT

A comparator circuit includes a first comparator arranged to compare an input signal with a reference voltage so as to generate a first comparison signal, a second comparator arranged to compare the input signal with a variable reference voltage so as to generate a second comparison signal, a variable reference voltage generator arranged to generate the variable reference voltage, and a logic unit arranged to output one of the first comparison signal and the second comparison signal as a comparison signal. The logic unit outputs the first comparison signal as the comparison signal while controlling the variable reference voltage generator to sweep the variable reference voltage until the first comparison signal and the second comparison signal exhibit desired response behaviors, and moves to a state capable of outputting the second comparison signal as the comparison signal after the sweep of the variable reference voltage is completed.

11 Claims, 13 Drawing Sheets

(58) Field of Classification Search
CPC .............. H03M 1/1071; H03K 5/2472; Y02B 70/1466
USPC ................. 323/205–211, 222–226, 271–277, 323/280–288, 351; 363/21.05, 21.13, 74, 363/123–127, 147; 341/118, 120, 121, 341/144, 155, 158
See application file for complete search history.

(56) References Cited

U.S. PATENT DOCUMENTS

| | | | |
|---|---|---|---|
| 8,710,810 B1* | 4/2014 | McJimsey | H02M 3/1584 323/272 |
| 2009/0140708 A1* | 6/2009 | Tateishi | H02M 3/1588 323/282 |
| 2009/0315523 A1* | 12/2009 | Kumagai | H02M 3/156 323/272 |
| 2010/0001888 A1 | 1/2010 | Nakajima | |
| 2012/0039098 A1* | 2/2012 | Berghegger | H02M 3/33507 363/21.13 |

* cited by examiner

COMPARATOR CIRCUIT, POWER SUPPLY CONTROL IC, AND SWITCHING POWER SUPPLY DEVICE

CROSS-REFERENCE TO RELATED APPLICATIONS

This nonprovisional application claims priority under 35 U.S.C. § 119(a) on Patent Applications No. 2015-93249 filed in Japan on Apr. 30, 2015, the entire contents of which are hereby incorporated by reference.

BACKGROUND OF THE INVENTION

Field of the Invention

The invention disclosed in this specification relates to a comparator circuit having an offset automatic correction technique between a plurality of comparators, and a power supply control IC and a switching power supply device using the comparator circuit.

Description of Related Art

Conventionally, there is known a comparator that can selectively use a plurality of comparators having different circuit characteristics in accordance with a state.

However, in the conventional comparator circuit, if input offsets of the comparators are largely different from each other, logic switching timing of a comparison signal differs even if the same input signal is compared with the same reference voltage. As a result, there is a problem that an output accuracy of the entire comparator circuit is deteriorated.

Further, an offset adjusting method disclosed in JP-A-2010-35140 includes comparing an output of a first comparator with an output of a second comparator, and setting offset amounts having opposite polarities to the comparators in accordance with the comparison result, and is different from the present invention in the essential structure.

SUMMARY OF THE INVENTION

In view of the above-mentioned problem found by the inventors, it is an object of the invention disclosed in this specification to provide a comparator circuit that can selectively use a plurality of comparators having different characteristics without deterioration of output accuracy, and a power supply control IC as well as a switching power supply device using the comparator circuit.

For instance, the comparator circuit disclosed in this specification includes a first comparator arranged to compare an input signal with a reference voltage so as to generate a first comparison signal, a second comparator arranged to compare the input signal with a variable reference voltage so as to generate a second comparison signal, a variable reference voltage generator arranged to generate the variable reference voltage, and a logic unit arranged to output one of the first comparison signal and the second comparison signal as a comparison signal. The logic unit outputs the first comparison signal as the comparison signal while controlling the variable reference voltage generator to sweep the variable reference voltage until the first comparison signal and the second comparison signal exhibit desired response behaviors, and moves to a state capable of outputting the second comparison signal as the comparison signal after the sweep of the variable reference voltage is completed.

Further, other features, elements, steps, advantages, and characteristics of the present invention will be apparent from the following description of embodiments and the attached drawings.

DETAILED DESCRIPTION OF THE PREFERRED EMBODIMENTS

<Switching Power Supply Device>

Figure 1:
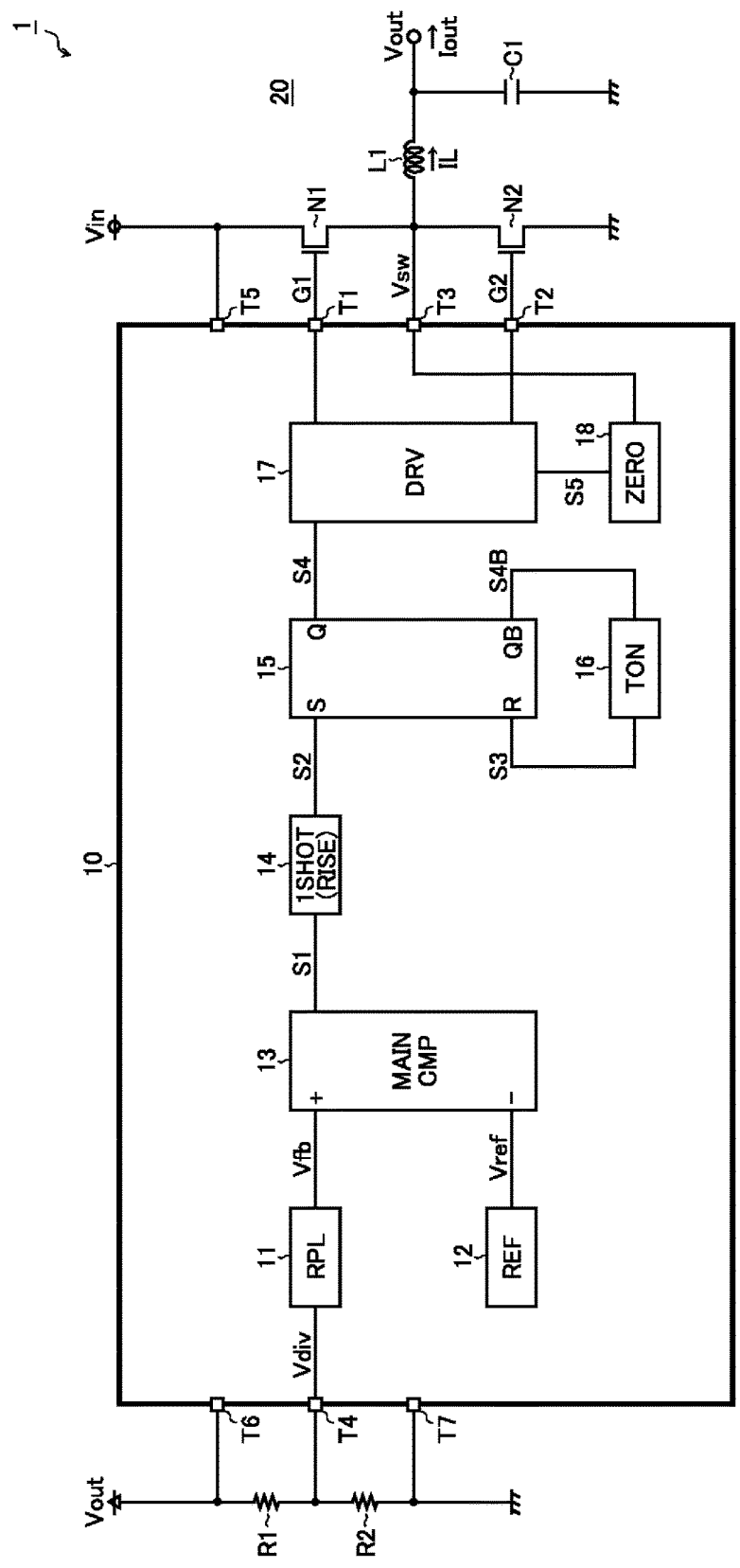
FIG. 1 is a block diagram illustrating an overall structure of a switching power supply device.

FIG. 1 is a block diagram illustrating an overall structure of a switching power supply device. A switching power supply device 1 of this structure example is a step-down type DC/DC converter that generates an output voltage Vout from an input voltage Vin by a nonlinear control method (a bottom detection on-time fixing method). The switching power supply device 1 includes a semiconductor device 10, and a switch output stage 20 constituted of various discrete components (N-channel metal oxide semiconductor (MOS) field-effect transistors N1 and N2, a coil L1, a capacitor C1, and resistors R1 and R2) connected externally to the semiconductor device 10.

The semiconductor device 10 is a main device that integrally controls the entire operation of the switching power supply device 1 (a so-called power supply control IC). The semiconductor device 10 includes external terminals T1 to T7 (an upper gate terminal T1, a lower gate terminal T2, a switch terminal T3, a feedback terminal T4, an input voltage terminal T5, an output voltage terminal T6, and a ground terminal T7) as means arranged to establish electric connection with the outside of the device.

The external terminal T1 is connected to a gate of the transistor N1. The external terminal T2 is connected to a gate of the transistor N2. The external terminal T3 is connected to an application terminal of a switch voltage Vsw (a connection node of a source of the transistor N1 and a drain of the transistor N2). The external terminal T4 is connected to an application terminal of a divided voltage Vdiv (a connection node of the resistor R1 and the resistor R2). The external terminal T5 is connected to an application terminal of the input voltage Vin. The external terminal T6 is connected to an application terminal of the output voltage Vout. The external terminal T7 is connected to a ground terminal.

Next, connection relationship of the discrete components connected externally to the semiconductor device 10 is described. A drain of the transistor N1 is connected to an application terminal of the input voltage Vin. A source of the transistor N2 is connected to the ground terminal. A source of the transistor N1 and a drain of the transistor N2 are both connected to a first terminal of the coil L1. A second terminal of the coil L1 and a first terminal of the capacitor C1 are both connected to the application terminal of the output voltage Vout. A second terminal of the capacitor C1 is connected to the ground terminal. The resistor R1 and the resistor R2 are connected in series between the application terminal of the output voltage Vout and the ground terminal.

The transistor N1 is an output transistor that is turned on and off in accordance with a gate signal G1 input from the external terminal T1. The transistor N2 is a synchronous rectification transistor that is turned on and off in accordance with a gate signal G2 input from the external terminal T2. Note that it is possible to use a diode instead of the transistor N2 as a rectifying element. In addition, the transistors N1 and N2 may be incorporated in the semiconductor device 10. The coil L1 and the capacitor C1 function as a rectifying and smoothing unit that rectifies and smooths the switch voltage Vsw having a rectangular waveform at the external terminal T3 so as to generate the output voltage Vout. The resistors R1 and R2 function as a divided voltage generator that divides the output voltage Vout so as to generate the divided voltage Vdiv. However, if the output voltage Vout is within an input dynamic range of a ripple injection circuit 11 (or a main comparator 13), the divided voltage generator may be eliminated.

Next, an inside structure of the semiconductor device 10 is described. In the semiconductor device 10, there are integrated the ripple injection circuit 11, a reference voltage generation circuit 12, the main comparator 13, a one-shot pulse generation circuit 14, an RS flip-flop 15, an on-time setting circuit 16, a gate driver circuit 17, and a reverse current detection circuit 18.

The ripple injection circuit 11 adds a ripple voltage Vrpl (a pseudo ripple component simulating a coil current IL flowing in the coil L1) to the divided voltage Vdiv so as to generate a feedback voltage Vfb (i.e., Vdiv+Vrpl). By introducing this ripple injection technique, even if a ripple component of the output voltage Vout (and hence the divided voltage Vdiv) is not so large, stable switching control can be performed, and therefore a multilayer ceramic capacitor or the like having a small ESR can be used as the capacitor C1. However, if the ripple component of the output voltage Vout is large enough, the ripple injection circuit 11 can be eliminated.

The reference voltage generation circuit 12 generates a predetermined reference voltage Vref.

The main comparator 13 compares the feedback voltage Vfb input to a non-inversion input terminal (+) with the reference voltage Vref input to an inversion input terminal (−) so as to generate a comparison signal S1. The comparison signal S1 becomes a low level when the feedback voltage Vfb is higher than the reference voltage Vref, while it becomes a high level when the feedback voltage Vfb is lower than the reference voltage Vref.

The one-shot pulse generation circuit 14 generates a one-shot pulse (e.g., a falling pulse) in a set signal S2 when triggered by a falling edge of the comparison signal S1.

The RS flip-flop 15 sets an output signal S4 to the high level at a pulse edge (e.g., a falling edge) of the set signal S2 input to a set terminal (S), while it resets the output signal S4 to the low level at a pulse edge (e.g., a falling edge) of a reset signal S3 input to a reset terminal (R).

The on-time setting circuit 16 generates a one-shot pulse (e.g., a falling pulse) in the reset signal S3 when a predetermined on-time Ton elapses after an inverted output signal S4B of the RS flip-flop 15 (i.e., a logical inversion signal of the output signal S4) falls to the low level.

The gate driver circuit 17 generates the gate signals G1 and G2 in accordance with the output signal S4 of the RS flip-flop 15 and switches the transistors N1 and N2 in a complementary manner. Note that the term "complementary" used in this specification means not only a case where on and off of the transistors N1 and N2 are completely opposite but also a case where a delay time is set between one and off of the transistors N1 and N2 in view of preventing a through current (where a so-called simultaneous off period (a dead time) is set).

The reverse current detection circuit 18 monitors a reverse current of the coil current IL (the coil current IL flowing from the coil L1 to the ground terminal via the transistor N2) so as to generate a reverse current detection signal S5. When the reverse current of the coil current IL is detected, the reverse current detection signal S5 is latched to the high level (a logic level when the reverse current is detected). At a rising edge of the gate signal G1 in the next period, the reverse current detection signal S5 is reset to the low level (a logic level when the reverse current is not detected). Further, as a method of monitoring the reverse current of the coil current IL, for example, there is a method of detecting a zero cross point at which the switch voltage Vsw is switched from negative to positive during an on period of the transistor N2. When the reverse current detection signal S5 is the high level, the gate driver circuit 17 generates the gate signal G2 so as to turn off the transistor N2 regardless of the output signal S4.

Further, the ripple injection circuit 11, the reference voltage generation circuit 12, the main comparator 13, the one-shot pulse generation circuit 14, the RS flip-flop 15, the on-time setting circuit 16, the gate driver circuit 17, and the reverse current detection circuit 18 function as a switching control circuit of the nonlinear control method (the bottom detection on-time fixing method in this structure example), which controls on and off of the transistors N1 and N2 in accordance with a comparison result between the feedback voltage Vfb and the reference voltage Vref, so as to generate the output voltage Vout from the input voltage Vin.

<Switching Operation>

Figure 2:
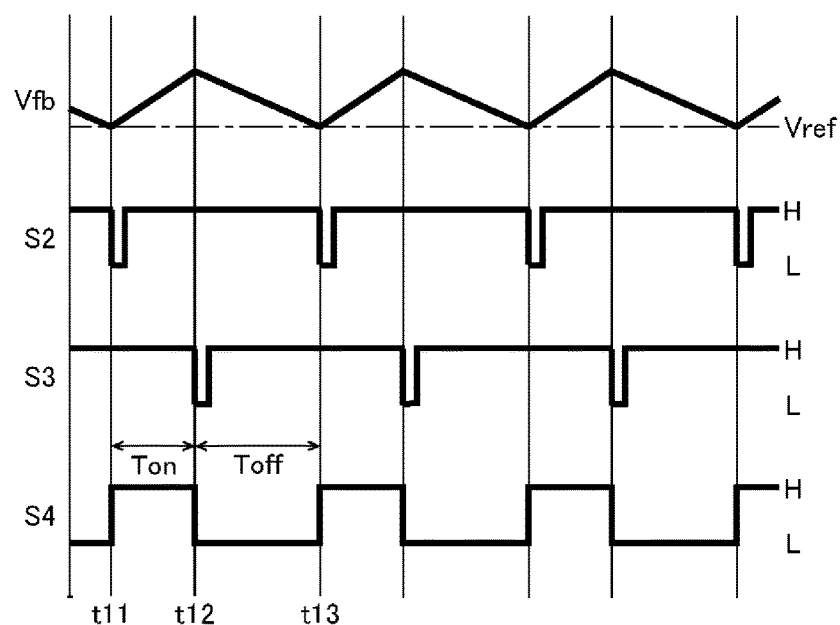
FIG. 2 is a timing chart illustrating a switching operation with a heavy load.

FIG. 2 is a timing chart illustrating a switching operation with heavy load (in a continuous current mode), in which the feedback voltage Vfb, the set signal S2, the reset signal S3, and the output signal S4 are shown in order from top to bottom.

When feedback voltage Vfb decreases to the reference voltage Vref at a time point t11, the set signal S2 falls to the low level, and the output signal S4 is changed to the high level. Accordingly, the transistor N1 is turned on so that the feedback voltage Vfb is changed to increase.

After that, when the on-time Ton elapses, the reset signal S3 falls to the low level at a time point t12, and the output signal S4 is changed to the low level. Accordingly, the transistor N1 is turned off so that the feedback voltage Vfb is changed to decrease again.

The gate driver circuit 17 generates the gate signals G1 and G2 in accordance with the output signal S4 and uses the same so as to control on/off of the transistors N1 and N2. Specifically, when the output signal S4 is the high level, basically the gate signal G1 is the high level so that the transistor N1 is turned on, while the gate signal G2 is the low level so that the transistor N2 is turned off. On the contrary, when the output signal S4 is the low level, basically the gate signal G1 is the low level so that the transistor N1 is turned off, while the gate signal G2 is the high level so that the transistor N2 is turned on.

By the on/off control of the transistors N1 and N2 described above, the switch voltage Vsw having a rectangular waveform appears at the external terminal T3. The switch voltage Vsw is rectified and smoothed by the coil L1 and the capacitor C1 so that the output voltage Vout is generated. Further, the output voltage Vout is divided by the resistors R1 and R2 so that the divided voltage Vdiv (and therefore the feedback voltage Vfb) is generated. This output feedback control enables the switching power supply device 1 to generate the desired output voltage Vout from the input voltage Vin with a very simple structure.

<Reverse Current Breaking Operation>

Figure 3:
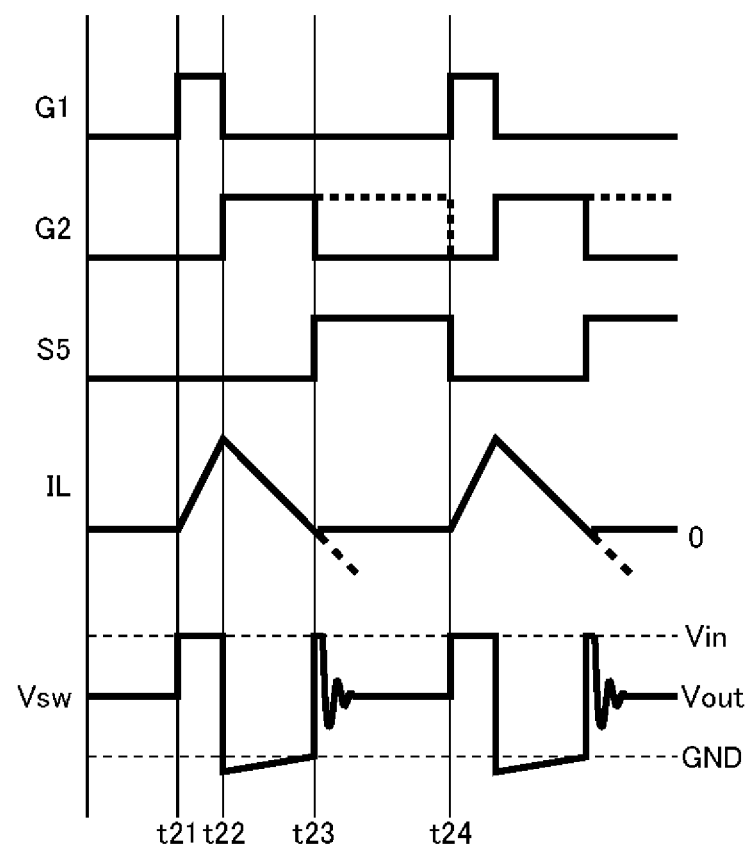
FIG. 3 is a timing chart illustrating a reverse current breaking operation with a light load.

FIG. 3 is a timing chart illustrating a reverse current breaking operation with a light load (in a discontinuous current mode), in which the gate signals G1 and G2, the reverse current detection signal S5, the coil current IL, and the switch voltage Vsw are shown in order from top to bottom.

From a time point t21 to a time point t22, the gate signal G1 is the high level while the gate signal G2 is the low level, and hence the transistor N1 is turned on while the transistor N2 is turned off. Accordingly, from the time point t21 to the time point t22, the switch voltage Vsw increases to substantially the input voltage Vin so that the coil current IL increases.

When the gate signal G1 is decreased to the low level while the gate signal G2 is increased to the high level at the time point t22, the transistor N1 is turned off while the transistor N2 is turned on. Accordingly, the switch voltage Vsw is decreased to a negative voltage (i.e., GND−IL×RN2, where RN2 is an on resistance of the transistor N2) so that the coil current IL is changed to decrease.

Here, in a heavy load in which an output current Iout flowing in a load is large enough, an energy stored in the coil L1 is large, and hence the coil current IL continues to flow to the load without becoming lower than zero so that the switch voltage Vsw is maintained at a negative voltage, until a time point t24 at which the gate signal G1 is increased to the high level again. On the other hand, in a light load in which the output current Iout flowing in the load is small, the energy stored in the coil L1 is small, and hence the coil current IL becomes lower than zero at a time point t23. Thus, the reverse current of the coil current IL is generated so that the polarity of the switch voltage Vsw is switched from negative to positive. In this state, the charge stored in the capacitor C1 is returned to the input side via the coil L1, and hence efficiency with a light load is deteriorated.

Accordingly, the switching power supply device 1 detects the reverse current of the coil current IL (a polarity inversion of the switch voltage Vsw) using the reverse current detection circuit 18 and turns off the transistor N2 in a high level period of the reverse current detection signal S5 (from the time point t23 to the time point t24). With this structure, the reverse current of the coil current IL can be quickly cut off, and hence efficiency deterioration with a light load can be canceled.

<Main Comparator (First Structure Example)>

Figure 4:
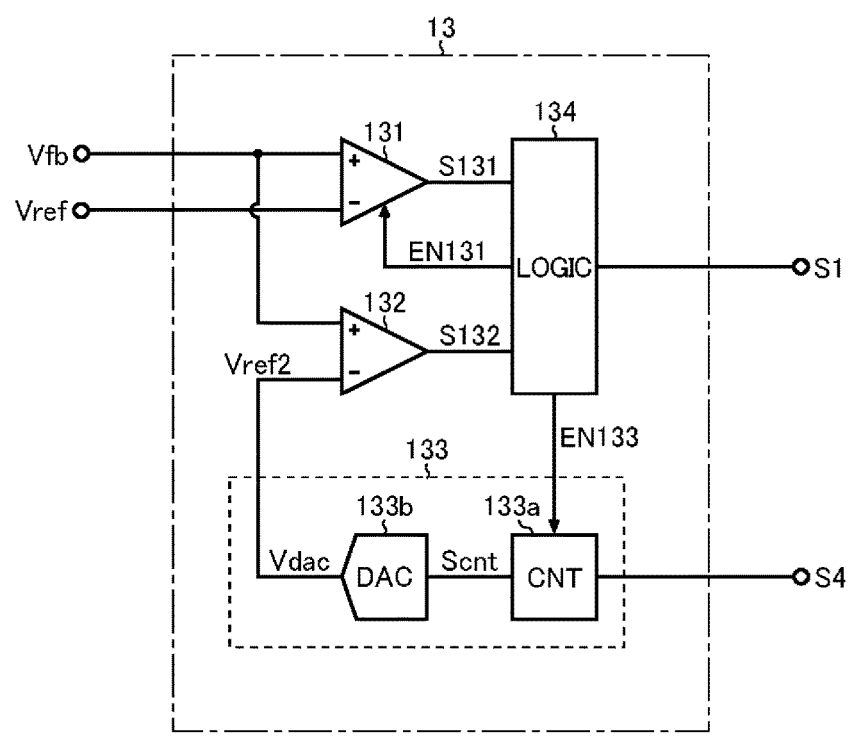
FIG. 4 is a block diagram illustrating a first structure example of a main comparator 13.

FIG. 4 is a block diagram illustrating a first structure example of the main comparator 13. The main comparator 13 of this structure example is a comparator circuit arranged to compare the feedback voltage Vfb (corresponding to the input signal) with the reference voltage Vref so as to generate the comparison signal S1, and includes a first comparator 131, a second comparator 132, a variable reference voltage generator 133, and a logic unit 134.

The first comparator 131 compares the feedback voltage Vfb input to the non-inversion input terminal (+) with the reference voltage Vref input to the inversion input terminal (−) so as to generate a first comparison signal S131. The first comparison signal S131 becomes the high level when the feedback voltage Vfb is higher than the reference voltage Vref, while it becomes the low level when the feedback voltage Vfb is lower than the reference voltage Vref.

In addition, the first comparator 131 is enabled or disabled by an enable signal EN131 input from the logic unit 134. Specifically, the first comparator 131 is enabled when the enable signal EN131 is a first logic level (i.e., an enable logic level), while it is disabled when the enable signal EN131 is a second logic level (i.e., a disable logic level). Further, by setting the first comparator 131 to the disabled state, its power consumption can be substantially zero.

The second comparator 132 compares the feedback voltage Vfb input to the non-inversion input terminal (+) with a variable reference voltage Vref2 input to the inversion input terminal (−) so as to generate a second comparison signal S132. The second comparison signal S132 becomes the high level when the feedback voltage Vfb is higher than the variable reference voltage Vref2, while it becomes the low level when the feedback voltage Vfb is lower than the variable reference voltage Vref2. Further, unlike the first comparator 131, the second comparator 132 always continues to operate after the semiconductor device 10 is activated.

Note that a response speed of the first comparator 131 is faster than the response speed of the second comparator 132. In addition, power consumption of the second comparator 132 is much smaller than power consumption of the first comparator 131. In other words, the first comparator 131 is a fast response type to which improvement of the response speed is given higher priority than reduction of the power consumption, while the second comparator 132 is a very low power consumption type to which the reduction of the power consumption is given higher priority than the improvement of the response speed.

The variable reference voltage generator 133 is a circuit unit arranged to generate the variable reference voltage Vref2 and includes a counter 133a and a DAC 133b.

When an enable signal EN133 input from the logic unit 134 is the first logic level (i.e., the enable logic level), the counter 133a counts the number of pulses of the output signal S4 so as to output a counter value Scnt. The output signal S4 is a logic signal synchronized with a switching period Tsw (i.e., 1/fsw) of the switching power supply device 1. Accordingly, the counter value Scnt is incremented every time when an on timing of the transistor N1 comes basically in synchronization with the switching period Tsw. Note that the set signal S2, the gate signal G1, or the like may be used as the logic signal synchronized with the switching period Tsw.

The DAC 133b converts the digital counter value Scnt into an analog voltage Vdac and outputs the same as the variable reference voltage Vref2. Accordingly, the variable reference voltage Vref2 is increased step by step along the increment of the counter value Scnt.

In this way, the variable reference voltage generator 133 has a function of sweeping the variable reference voltage Vref2 in synchronization with the switching period Tsw of the switching power supply device 1. Note that an initial value of the variable reference voltage Vref2 when starting the sweep should be set to a voltage value lower than the reference voltage Vref (i.e., a voltage value obtained by adding a negative offset to the reference voltage Vref).

The logic unit 134 outputs one of the first comparison signal S131 and the second comparison signal S132 as the comparison signal S1. Further, while the logic unit 134 outputs the first comparison signal S131 as the comparison signal S1, the logic unit 134 sets the enable signal EN131 to the first logic level (i.e., the enable logic level) so that the first comparator 131 operates. On the other hand, while the logic unit 134 outputs the second comparison signal S132 as the comparison signal S1, the logic unit 134 sets the enable signal EN131 to the second logic level (i.e., the disable logic level) so that the first comparator 131 is stopped.

More specifically, if the main comparator 13 is required to have the fast response performance (e.g., with a heavy load), the logic unit 134 enables the first comparator 131 to operate so as to output the first comparison signal S131 as the comparison signal S1. On the other hand, if the main comparator 13 is required to have the power saving property (e.g., with a very light load or no load), the logic unit 134 stops the first comparator 131 so as to output the second comparison signal S132 as the comparison signal S1. In this way, the logic unit 134 has a function of selectively use the first comparator 131 for fast response and the second comparator 132 for very low power consumption in accordance with a state (a load state).

However, if an input offset of the first comparator 131 is largely different from an input offset of the second comparator 132, the logic switching timing of the comparison signal S1 differs depending on which one of the first comparator 131 and the second comparator 132 is used, and hence output accuracy of the entire main comparator 13 (and therefore accuracy of the output voltage Vout) is deteriorated.

Accordingly, in order to stop the operation of the first comparator 131 and to enable the second comparator 132, it is necessary to cancel the mismatch of the input offset between the comparators before that. Hereinafter, with reference to FIGS. 5 and 6, an automatic offset adjustment operation (or an auto offset calibration (AOC) operation) of the main comparator 13 is described in detail.

Figure 5:
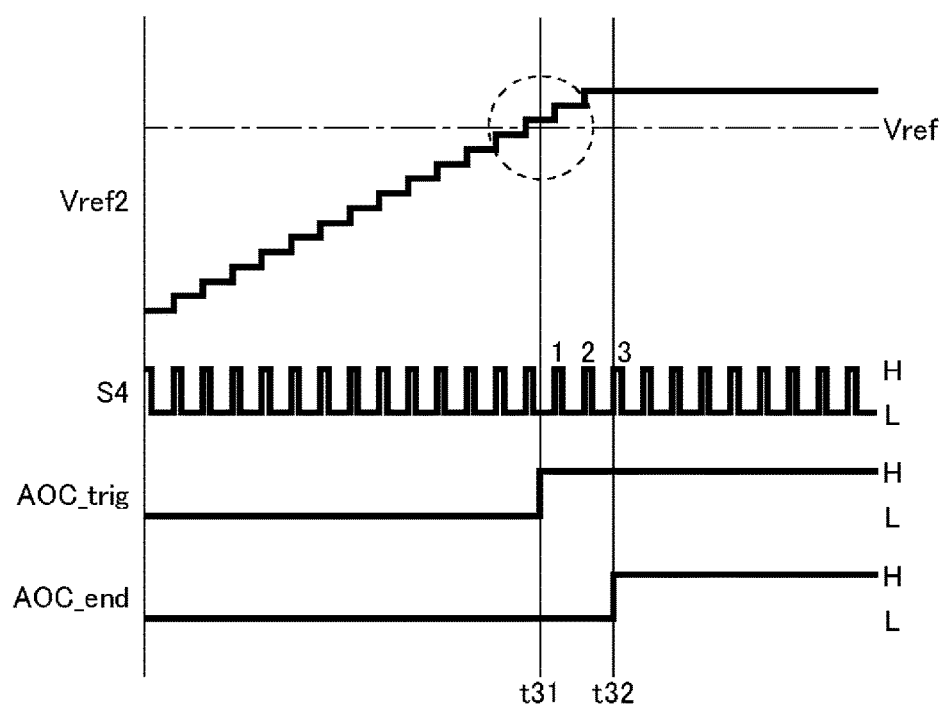
FIG. 5 is a timing chart illustrating a first example of an automatic offset adjustment operation.

FIG. 5 is a timing chart illustrating a first example of the automatic offset adjustment operation, in which the variable reference voltage Vref2, the output signal S4, a trigger signal AOC_trig, and an adjustment completion signal AOC_end are shown in order from top to bottom. Further, as described later in detail, the trigger signal AOC_trig and the adjustment completion signal AOC_end are both logic signals handled inside the logic unit 134.

Figure 6:
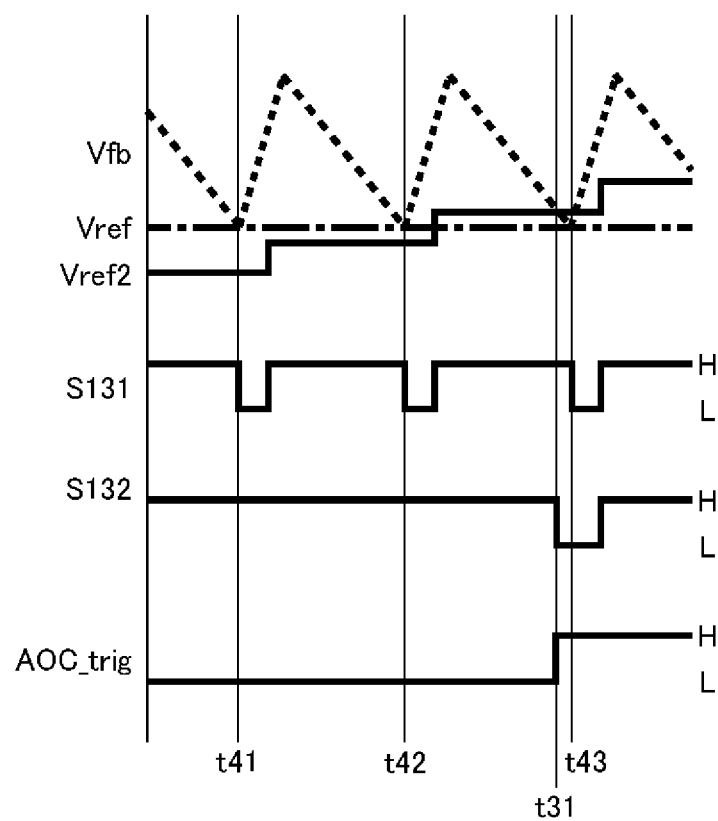
FIG. 6 is an enlarged timing chart of FIG. 5 at a time point t31 and its vicinity.

Further, FIG. 6 is an enlarged timing chart of FIG. 5 at a time point t31 and its vicinity, in which the feedback voltage Vfb (a broken line), the reference voltage Vref (a dot-dashed line), the variable reference voltage Vref2 (a solid line), the first comparison signal S131, the second comparison signal S132, and the trigger signal AOC_trig are shown in order from top to bottom.

After the semiconductor device 10 is activated, the logic unit 134 sets both the enable signals EN131 and 133 to the first logic level (i.e., the enable logic level) so as to output the first comparison signal S131 as the comparison signal S1, while it monitors the first comparison signal S131 and the second comparison signal S132 and controls the variable reference voltage generator 133 so as to sweep the variable reference voltage Vref2 until the first comparison signal S131 and the second comparison signal S132 exhibit desired response behaviors.

The above-mentioned desired response behavior means, for example, a state as shown in the chart at the time point t31 in which the variable reference voltage Vref2 becomes higher than the reference voltage Vref as the counter value Scnt increments, and the second comparator 132 responds faster than the first comparator 131 so that the second comparison signal S132 falls to the low level before the first comparison signal S131 falls to the low level.

The trigger signal AOC_trig is a logic signal indicating whether or not the desired response behavior has been detected. As shown in the chart before the time point t31 (at time points t41 and t42), while the first comparator 131 is responding faster than the second comparator 132 (i.e., while the second comparison signal S132 is maintained at the high level), the trigger signal AOC_trig is maintained at the low level. On the other hand, as shown in the chart at the time point t31, the variable reference voltage Vref2 becomes higher than the reference voltage Vref, and the second comparator 132 responds faster than the first comparator 131, so that the second comparison signal S132 falls to the low level before the first comparison signal S131 falls to the low level. Then, the trigger signal AOC_trig rises to the high level.

At this time point, the sweep of the variable reference voltage Vref2 can be finished. However, in the example of this chart, after the trigger signal AOC_trig rises to the high level, the sweep of the variable reference voltage Vref2 (i.e., the increment of the counter value Scnt) is further continued for a period corresponding to two pulses of the output signal S4. Further, when a third pulse of the output signal S4 rises at a time point t32, the adjustment completion signal AOC_end rises to the high level, and the series of the automatic offset adjustment operation is finished.

In this case, the logic unit 134 sets the enable signal EN133 to the second logic level (i.e., the disable logic level) so as to stop the sweep operation of the variable reference voltage Vref2 (i.e., the pulse count operation of the output signal S4). Accordingly, after that, the variable reference voltage Vref2 is maintained at a voltage value at the time point when the sweep is finished.

Further, the sweep continuing time of the variable reference voltage Vref2 after the trigger signal AOC_trig is changed to the high level is appropriately set in consideration of the response delay difference between the first comparator 131 and the second comparator 132.

In other words, when the series of the automatic offset adjustment operation is performed, the logic unit 134 delays the sweep completion timing of the variable reference voltage Vref2, so that the variable reference voltage Vref2 crosses the feedback voltage Vfb earlier than the reference voltage Vref by the response delay difference between the first comparator 131 and the second comparator 132. In this way, because an offset difference is set between the first comparator 131 and the second comparator 132, the response delay difference between the comparators can be canceled. Thus, output accuracy of the comparison signal S1 can be improved.

After the series of automatic offset adjustment operation (i.e., the sweep operation of the variable reference voltage Vref2) is completed, the logic unit 134 changes to a state where the second comparison signal S132 can be output as the comparison signal S1. In this way, before changing from an operation mode using the first comparator 131 (i.e., a fast response mode) to an operation mode using the second comparator 132 (i.e., a very low power consumption mode), the mismatch of the input offset between the comparators is canceled so that the same output accuracy can be maintained in both the operation modes.

On the contrary, unless the series of automatic offset adjustment operation is completed, even if the switching power supply device 1 becomes a very light load state or a no load state, the first comparator 131 is not stopped, and the output feedback control corresponding to the first comparison signal S1 is continued.

In addition, as understood from the above description, the main comparator 13 executes the series of automatic offset adjustment operation in parallel with a normal output feedback control using the first comparator 131. Accordingly, the switching power supply device 1 can start the output operation quickly after the semiconductor device 10 is activated.

Note that it is possible to perform the sweep of the variable reference voltage Vref2 (i.e., the increment of the counter value Scnt) in an asynchronous manner with the switching period Tsw. However, if such a structure is adopted, the variable reference voltage Vref2 may be increased at a timing when even the first comparator 131 has not responded, or on the contrary, the variable reference voltage Vref2 may not be increased despite that the first comparator 131 has responded earlier than the second comparator 132. On the other hand, as described above, with the structure in which the sweep of the variable reference voltage Vref2 is performed in synchronization with the switching period Tsw, there is little possibility that such a malfunction will occur.

In addition, FIGS. 5 and 6 illustrate a behavior in a case in which the input offset of the first comparator 131 is equal (or substantially equal) to the input offset of the second comparator 132, i.e., an example in which the response order of the first comparator 131 and the second comparator 132 is reversed just after the variable reference voltage Vref2 becomes larger than the reference voltage Vref.

However, depending on a mismatch degree (a polarity and a level of the mismatch) of the input offset between the comparators, the response order of the first comparator 131 and the second comparator 132 may be reversed before the variable the reference voltage Vref2 crosses the reference voltage Vref, or on the contrary, the response order of the first comparator 131 and the second comparator 132 may not be reversed soon even if the variable reference voltage Vref2 crosses the reference voltage Vref. However, according to the above-mentioned automatic offset adjustment operation, the mismatch can be appropriately canceled regardless of a mismatch degree of the input offset.

<Main Comparator (Second Structure Example)>

Figure 7:
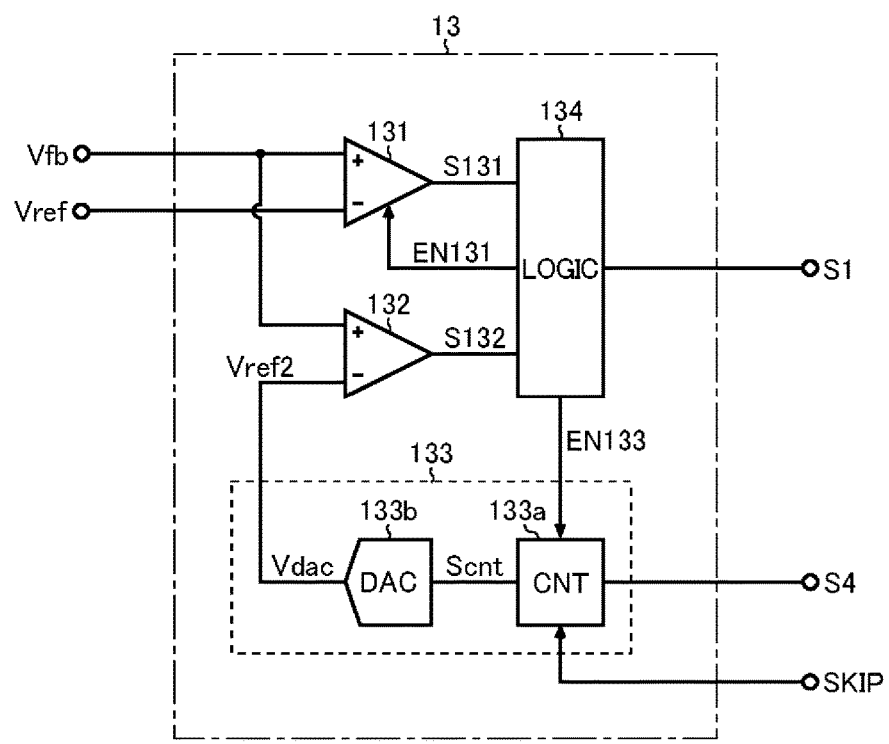
FIG. 7 is a block diagram illustrating a second structure example of the main comparator 13.

FIG. 7 is a block diagram illustrating a second structure example of the main comparator 13. The main comparator 13 of this structure example has a structure based on the first structure example (FIG. 4) described above, in which an operation mode discriminant signal SKIP is input to the variable reference voltage generator 133 (more specifically, the counter 133a). Accordingly, a circuit component similar to that in the first structure example is denoted by the same numeral as in FIG. 4 so that overlapping description is omitted. Hereinafter, a characteristic part of the second structure example is mainly described.

When the switching operation of the switching power supply device 1 is performed at high speed, a logic level of the second comparison signal S132 may not be correctly switched because of the response delay of the second comparator 132. Accordingly, in a situation where the switching period Tsw is short (e.g., with a heavy load), the automatic offset adjustment operation cannot always appropriately be performed.

Accordingly, the variable reference voltage generator 133 performs the sweep of the variable reference voltage Vref2 only when the switching period Tsw is longer than a predetermined value (for example, in the discontinuous current mode in which the response delay of the second comparator 132 is not a problem).

Further, in the main comparator 13 of the second structure example, as a method of discriminating whether or not the switching period Tsw is longer than a predetermined value, the operation mode discriminant signal SKIP is input to the counter 133a.

The operation mode discriminant signal SKIP is a logic signal, which becomes the high level when the reverse current of the coil current IL is detected so that the transistors N1 and N2 are both turned off (namely, in the discontinuous current mode), and becomes the low level when the transistor N1 is turned on before the reverse current of the coil current IL is detected (namely, in the continuous current mode). Further, although there is described the case where the operation mode discriminant signal SKIP becomes the high level without delay when switching to the discontinuous current mode, the operation mode discriminant signal SKIP may be a logic signal that becomes the high level when a predetermined period elapses after switching to the discontinuous current mode, for example. With this structure, it is possible to appropriately deal with the response delay of the second comparator 132.

Even if the enable signal EN133 is the first logic level (i.e., the enable logic level), when the operation mode discriminant signal SKIP is the low level (i.e., a logic level in the continuous current mode), the counter 133a temporarily stops the increment of the counter value Scnt without counting the number of pulses of the output signal S4.

Hereinafter, a temporary stop process of the automatic offset adjustment operation using the operation mode discriminant signal SKIP is described in detail.

Figure 8:
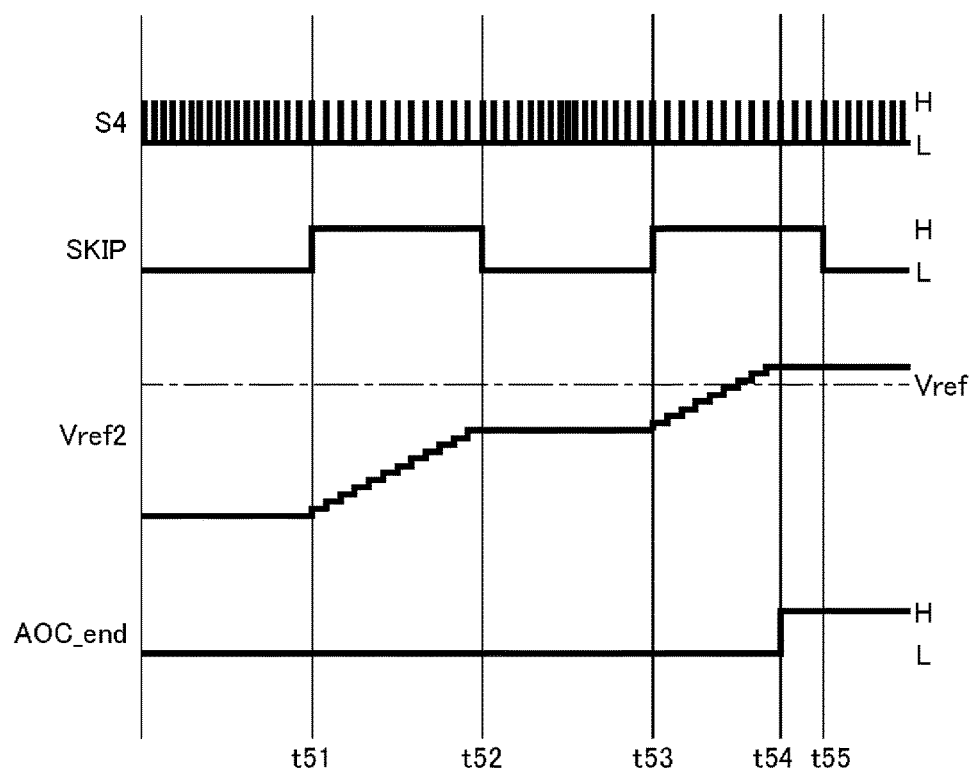
FIG. 8 is a timing chart illustrating a second example of the automatic offset adjustment operation.

FIG. 8 is a timing chart illustrating a second example of the automatic offset adjustment operation, in which the output signal S4, the operation mode discriminant signal SKIP, the variable reference voltage Vref2, and the adjustment completion signal AOC_end are shown in order from top to bottom.

As shown in the chart before a time point t51 and from a time point t52 to a time point t53, when the operation mode discriminant signal SKIP is the low level (i.e., the logic level in the continuous current mode), the sweep of the variable reference voltage Vref2 is stopped. Accordingly, the response delay of the second comparator 132 does not cause a malfunction of the automatic offset adjustment operation.

On the other hand, as shown in the chart from the time point t51 to the time point t52 and from the time point t53 to a time point t55, when the operation mode discriminant signal SKIP is the high level (i.e., a logic level in the discontinuous current mode), the sweep of the variable reference voltage Vref2 is performed.

The example of the chart shows a manner in which the automatic offset adjustment operation is not finished during a period of a first discontinuous current mode (from the time point t51 to the time point t52), but the automatic offset adjustment operation is finished during a period of a second discontinuous current mode (from the time point t53 to the time point t55).

In other words, temporary stop and restart of the automatic offset adjustment operation are repeated every time when the continuous current mode and the discontinuous current mode are switched. When the second comparison signal S132 falls to the low level before the first comparison signal S131 falls to the low level (at the time point t54 in the example of this chart), the adjustment completion signal AOC_end rises to the high level.

Accordingly, depending on a length of the discontinuous current mode period, the automatic offset adjustment operation may be completed after switching to the discontinuous current mode one time, or the automatic offset adjustment operation may be finally completed after switching to the discontinuous current mode a plurality of times.

<Main Comparator (Third Structure Example)>

Figure 9:
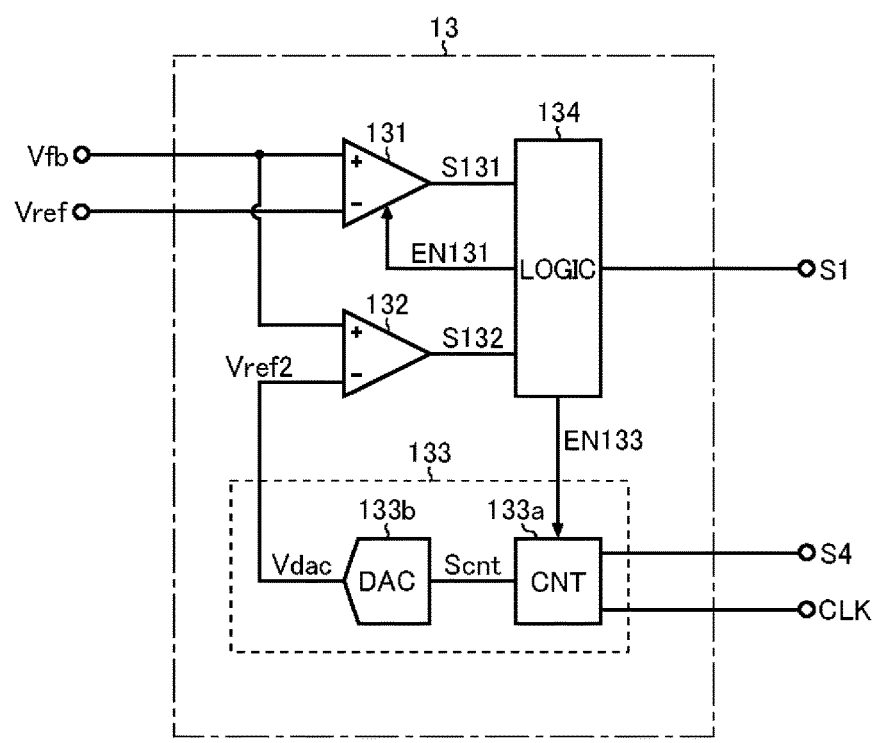
FIG. 9 is a circuit diagram illustrating a third structure example of the main comparator 13.

FIG. 9 is a circuit diagram illustrating a third structure example of the main comparator 13. The main comparator 13 of this structure example has a structure based on the first structure example (FIG. 4), in which a clock signal CLK is input to the variable reference voltage generator 133 (more specifically, the counter 133a). Accordingly, a circuit component similar to that in the first structure example is denoted by the same numeral as in FIG. 4 so that overlapping description is omitted. Hereinafter, a characteristic part of the third structure example is mainly described.

The clock signal CLK is a pulse signal having a clock period Tclk asynchronous to the switching period Tsw. As the clock signal CLK, it is possible to use a system clock signal necessary for operation of the logic unit 134, for example.

Further, the variable reference voltage generator 133 is configured to sweep the variable reference voltage Vref2 in synchronization with one of the switching period Tsw and the clock period Tclk asynchronous to the switching period Tsw.

Hereinafter, the initial setting process of the automatic offset adjustment operation using the clock signal CLK is described in detail.

Figure 10:
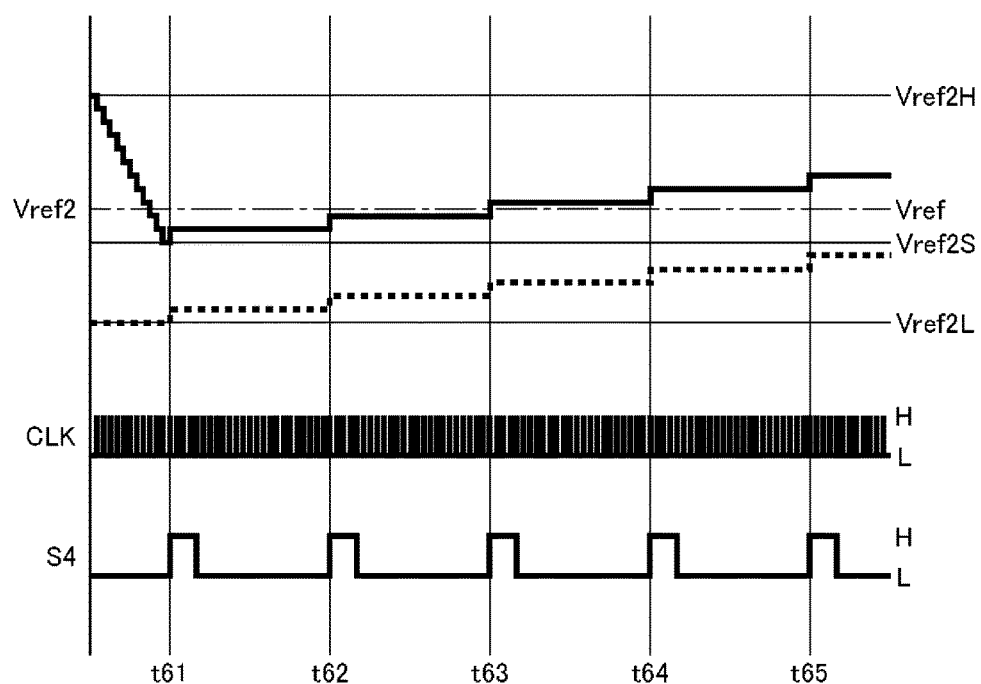
FIG. 10 is a timing chart illustrating a third example of the automatic offset adjustment operation.

FIG. 10 is a timing chart illustrating a third example of the automatic offset adjustment operation, in which the variable reference voltage Vref2, the clock signal CLK, and the output signal S4 are shown in order from top to bottom. Further, as to the variable reference voltage Vref2, a solid line shows a behavior in this operation example, and a broken line shows a behavior when the variable reference voltage Vref2 is increased step by step from a lower limit value Vref2L similarly to FIG. 5.

After the semiconductor device 10 is activated, the logic unit 134 synchronizes with the clock signal CLK as shown in the chart before a time point t61 and controls the variable reference voltage generator 133 to rapidly decrease the variable reference voltage Vref2 from an upper limit voltage Vref2H (>Vref) until crossing the reference voltage Vref. In this case, a counter 134a decrements the counter value Scnt one by one from the upper limit counter value in response to the number of pulses of the clock signal CLK.

After that, the logic unit 134 synchronizes with the output signal S4 as shown in the chart after the time point t61 and controls the variable reference voltage generator 133 to increase the variable reference voltage Vref2 from a sweep start voltage Vref2S (i.e., the variable reference voltage Vref2 at the decrement completion time point) until crossing the reference voltage Vref. In this case, the counter 134a increments the counter value Scnt one by one in response to the number of pulses of the output signal S4.

As apparent from the comparison between the solid line and the broken line of the variable reference voltage Vref2, with the structure in which the clock signal CLK faster than the output signal S4 is used so as to initially set the sweep start voltage Vref2S near the reference voltage Vref, and the variable reference voltage Vref2 is increased from the sweep start voltage Vref2S, it is possible to largely shorten the time necessary for the automatic offset adjustment operation compared with the structure in which the variable reference voltage Vref2 is increased from the lower limit value Vref2L.

<Main Comparator (Fourth Structure Example)>

Figure 11:
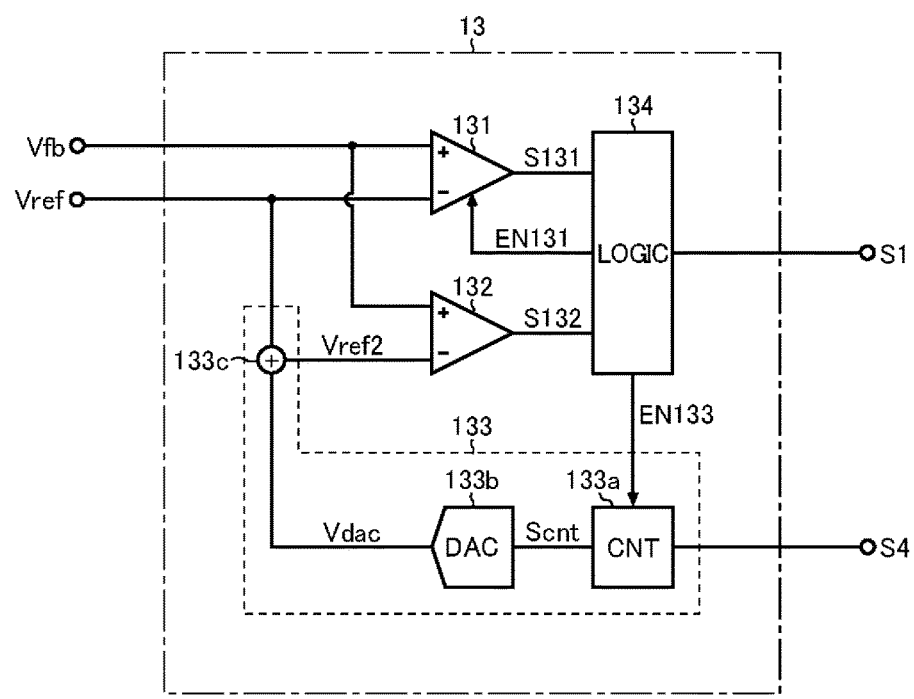
FIG. 11 is a circuit diagram illustrating a fourth structure example of the main comparator 13.

FIG. 11 is a circuit diagram illustrating a fourth structure example of the main comparator 13. The main comparator 13 of this structure example has a structure based on the first structure example (FIG. 4) described above, in which an adder unit 133c is added. Accordingly, a circuit component similar to that in the first structure example is denoted by the same numeral as in FIG. 4 so that overlapping description is omitted. Hereinafter, a characteristic part of the fourth structure example is mainly described.

The adder unit 133c adds the analog voltage Vdac to the reference voltage Vref so as to generate the variable reference voltage Vref2 (i.e., Vref+Vdac), and outputs the same to the inversion input terminal (−) of the second comparator 132.

In other words, the analog voltage Vdac is used not as the reference voltage Vref itself but as the offset voltage that is added to the variable reference voltage Vref2. Further, as to the analog voltage Vdac, an analog output value with respect to the counter value Scnt is set so that the variable reference voltage Vref2 can have both a positive and a negative voltage value with respect to the reference voltage Vref.

With this structure, the offset adjustment of the second comparator 132 can be performed with respect to the reference voltage Vref input to the first comparator 131 as a center value.

Further, although the first structure example (FIG. 4) is used as the base, it is possible to use the second structure example (FIG. 7) or the third structure example (FIG. 9) as the base, to which the adder unit 133c is added.

<Application to Television Set>

Figure 12:
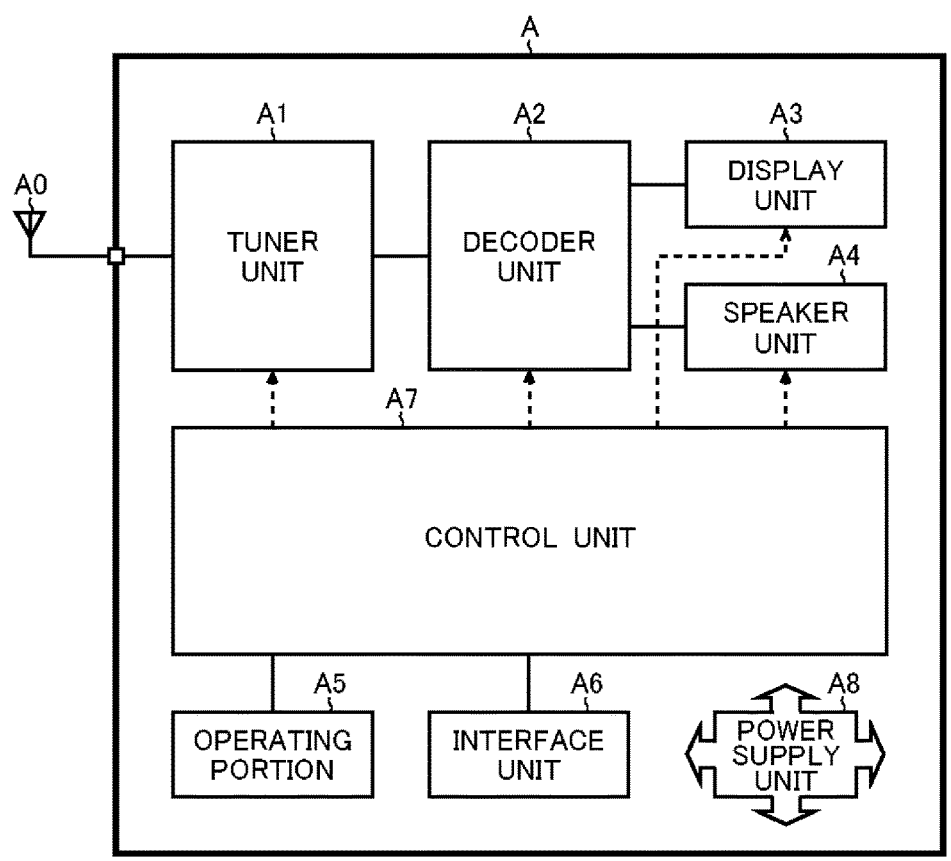
FIG. 12 is a block diagram illustrating a structure example of a television set equipped with the switching power supply device.
Figure 13A:
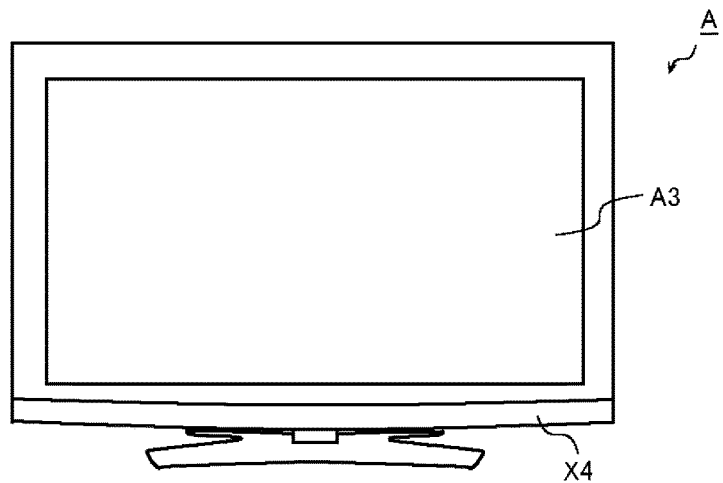
FIG. 13A is a front view of the television set equipped with the switching power supply device.
Figure 13B:
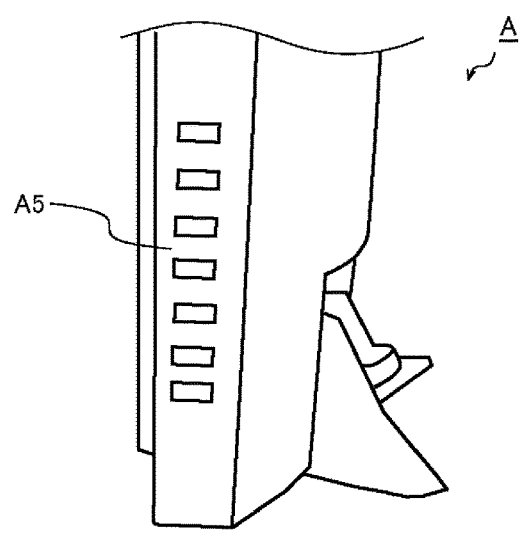
FIG. 13B is a side view of the television set equipped with the switching power supply device.
Figure 13C:
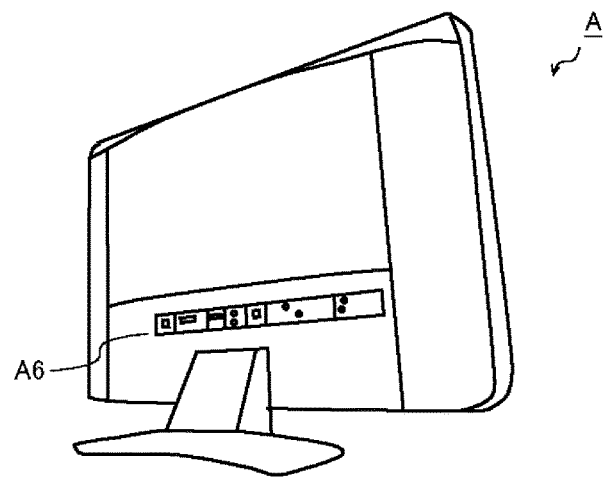
FIG. 13C is a rear view of the television set equipped with the switching power supply device.

FIG. 12 is a block diagram illustrating a structure example of a television set equipped with the switching power supply device described above. In addition, FIGS. 13A to 13C are respectively a front view, a side view, and a rear view of the television set equipped with the switching power supply device. A television set A of this structure example includes a tuner unit A1, a decoder unit A2, a display unit A3, a speaker unit A4, an operating portion A5, an interface unit A6, a control unit A7, and a power supply unit A8.

The tuner unit A1 selects a broadcasting signal of a desired channel from reception signals received by an antenna A0 connected externally to the television set A.

The decoder unit A2 generates a video signal and a sound signal from the broadcasting signal selected by the tuner unit A1. In addition, the decoder unit A2 also has a function of generating the video signal and the sound signal on the basis of an external input signal from the interface unit A6.

The display unit A3 outputs the video signal generated by the decoder unit A2 as images.

The speaker unit A4 outputs the signal generated by the decoder unit A2 as sounds.

The operating portion A5 is one of human interfaces arranged to receive a user's operation. As the operating portion A5, it is possible to use buttons, switches, a remote controller, or the like.

The interface unit A6 is a front end arranged to receive an external input signal from an external device (such as an optical disc player or a hard disk drive).

The control unit A7 integrally controls operations of the above-mentioned units A1 to A6. As the control unit A7, a central processing unit (CPU) or the like can be used.

The power supply unit A8 supplies power to the above-mentioned units A1 to A7. As the power supply unit A8, the switching power supply device 1 described above can be appropriately used.

<Other Variations>

Further, in the embodiment described above, there is described the example of the structure in which the present invention is applied to the step-down type switching power supply device, but applications of the present invention are not limited to this. For instance, the output stage of the switching power supply device may be a step-up type, a step up and down type, or a reverse type.

In addition, in the embodiment described above, the switching power supply device of the fixed on-time method (the on-time setting circuit) is exemplified and described, but applications of the present invention are not limited to this. On the basis of the same technical concept as the above description, it is possible to change a behavior of the variable reference voltage Vref2, so that the present invention can be applied to a switching power supply device of a fixed off-time method, too.

In this way, the structure of the present invention can be variously modified within the scope of the spirit of the invention in addition to the embodiment described above. In other words, the embodiment described above is merely an example in every aspect and should not be interpreted as a limitation. The technical scope of the present invention is defined not by the above description of the embodiment but by the claims, which should be interpreted to include all modifications within meanings and scopes equivalent to the claims.

INDUSTRIAL APPLICABILITY

The switching power supply device disclosed in this specification can be used as a power supply mounted in various electronic devices such as a liquid crystal display, a plasma display, a BD recorder/player, a set top box, and a personal computer (for example, a power supply for a system-on-chip (SOC) or a peripheral device).

What is claimed is:

1. A comparator circuit comprising:
a first comparator arranged to compare an input signal with a reference voltage so as to generate a first comparison signal;
a second comparator arranged to compare the input signal with a variable reference voltage so as to generate a second comparison signal;
a variable reference voltage generator arranged to generate the variable reference voltage; and
a logic unit arranged to output one of the first comparison signal and the second comparison signal as a comparison signal, wherein
a response speed of the first comparator is faster than a response speed of the second comparator, and a power consumption of the second comparator is smaller than a power consumption of the first comparator, and wherein
the logic unit outputs the first comparison signal as the comparison signal while controlling the variable reference voltage generator to sweep the variable reference voltage until, as a result of the variable reference voltage crossing the reference voltage and the second comparator responding faster than the first comparator, a logic level of the second comparison signal is switched before a logic level of the first comparison signal is switched, and moves to a state capable of outputting the second comparison signal as the comparison signal after the sweep of the variable reference voltage is completed.

2. The comparator circuit according to claim 1, wherein the logic unit stops the first comparator in a period while the second comparison signal is output as the comparison signal.

3. The comparator circuit according to claim 1, wherein the logic unit determines a completion timing of the sweep of the variable reference voltage so that the variable reference voltage crosses the input signal earlier than the reference voltage by a response delay difference between the first comparator and the second comparator.

4. The comparator circuit according to claim 1, wherein the comparator circuit is disposed in a switching power supply device of a nonlinear control method arranged to generate a desired output voltage from an input voltage, and receives the output voltage or a feedback voltage corresponding to the output voltage as the input signal.

5. The comparator circuit according to claim 4, wherein the variable reference voltage generator sweeps the variable reference voltage in synchronization with a switching period of the switching power supply device.

6. The comparator circuit according to claim 5, wherein the variable reference voltage generator includes a counter arranged to count the number of pulses of a logic signal synchronizing with the switching period, and a digital to analog converter arranged to convert a counter value of the counter to an analog voltage, and outputs the analog voltage or a voltage corresponding to the analog voltage as the variable reference voltage.

7. The comparator circuit according to claim 6, wherein the variable reference voltage generator further includes an adder unit arranged to add the analog voltage to the reference voltage so as to generate the variable reference voltage.

8. The comparator circuit according to claim 5, wherein the variable reference voltage generator performs the sweep of the variable reference voltage only when the switching period is longer than a predetermined value.

9. The comparator circuit according to claim 5, wherein the variable reference voltage generator sweeps the variable reference voltage in synchronization with one of the switching period and a clock period asynchronous with the switching period, and the logic unit controls the variable reference voltage generator to sweep the variable reference voltage in a first direction until crossing the reference voltage in synchronization with the clock period, and afterward to sweep the variable reference voltage in a second direction opposite to the first direction in synchronization with the switching period.

10. A power supply control IC, comprising in an integrated manner:
a ripple injection circuit arranged to superimpose a ripple voltage simulating a coil current on the output voltage or a divided voltage of the output voltage so as to generate a feedback voltage;

a reference voltage generation circuit arranged to generate reference voltage;

a main comparator arranged to compare the feedback voltage with the reference voltage so as to generate the comparison signal;

a one-shot pulse generation circuit arranged to generate a one-shot pulse on a set signal in accordance with the comparison signal;

an RS flip-flop arranged to set an output signal to a first logic level in accordance with the set signal and to reset the output signal to a second logic level in accordance with a reset signal;

an on-time setting circuit arranged to generate a one-shot pulse on the reset signal at a time point when a predetermined on-time elapses after the output signal is set to the first logic level;

a gate driver circuit arranged to generate a drive signal of an output transistor and a synchronous rectification transistor in accordance with the output signal; and a reverse current detection circuit arranged to detect reverse current of the coil current so as to turn off the synchronous rectification transistor, wherein the power supply control IC is equipped with the comparator circuit according to claim 4 as the main comparator.

11. The switching power supply device comprising: the power supply control IC according to claim 10; and a switch output stage, a part or a whole of the switch output stage being externally connected to the power supply control IC so as to generate the output voltage from the input voltage.

\* \* \* \* \*